United States Patent
Boehm et al.

(10) Patent No.: US 9,746,523 B2
(45) Date of Patent: Aug. 29, 2017

(54) METHOD FOR DETERMINING AT LEAST ONE STATE OF A PLURALITY OF BATTERY CELLS, COMPUTER PROGRAM, BATTERY AND MOTOR VEHICLE

(75) Inventors: Andre Boehm, Kornwestheim (DE); Stefan Wickert, Albershausen (DE)

(73) Assignees: Samsung SDI Co., Ltd., Yongin-si, Gyeonggi-do (KR); Robert Bosch GmbH, Stuttgart (DE)

( * ) Notice: Subject to any disclaimer, the term of this patent is extended or adjusted under 35 U.S.C. 154(b) by 894 days.

(21) Appl. No.: 13/805,309

(22) PCT Filed: May 10, 2011

(86) PCT No.: PCT/EP2011/057529
§ 371 (c)(1),
(2), (4) Date: Mar. 14, 2013

(87) PCT Pub. No.: WO2011/160890
PCT Pub. Date: Dec. 29, 2011

(65) Prior Publication Data
US 2013/0207462 A1    Aug. 15, 2013

(30) Foreign Application Priority Data
Jun. 24, 2010 (DE) .......... 10 2010 030 491

(51) Int. Cl.
G01R 31/36    (2006.01)
H01M 10/48    (2006.01)
B60L 11/18    (2006.01)

(52) U.S. Cl.
CPC ...... G01R 31/3606 (2013.01); B60L 11/1851 (2013.01); G01R 31/3658 (2013.01);
(Continued)

(58) Field of Classification Search
CPC ........... G01R 31/3606; G01R 31/3658; H01M 10/482; B60L 11/1851; B60L 11/1861; B60L 11/1864
(Continued)

(56) References Cited

U.S. PATENT DOCUMENTS

2004/0257042 A1* 12/2004 Liu ............... H01M 10/441
                                                              320/130
2006/0273802 A1* 12/2006 Murakami et al. .......... 324/434
(Continued)

FOREIGN PATENT DOCUMENTS

DE    199 59 019 A1    6/2001
EP    1 328 052 A2    7/2003
EP    2 159 585 A2    3/2010

OTHER PUBLICATIONS

IEEE Power & Energy Society, Livium 1625 IEEE Standard for Rechargeable Batteries for Multi-Cell Mobile Computing Devices, Oct. 20, 2008, 92 Pages, IEEE, New York, NY.
(Continued)

*Primary Examiner* — Rexford Barnie
*Assistant Examiner* — Thai Tran
(74) *Attorney, Agent, or Firm* — Maginot, Moore & Beck LLP

(57) ABSTRACT

The disclosure relates to a method for determining at least one state of a plurality of spatially combined battery cells connected to each other by circuitry. The state is determined by observing battery cells by means of at least one observer structure. A subset of a plurality of battery cells is observed and the state derived from the observation is determined for more battery cells than for the observed battery cells. The disclosure further relates to a battery comprising a battery management system, which is configured such that the method according to the disclosure can be carried out
(Continued)

thereby. The disclosure also relates to a motor vehicle comprising a battery according to the disclosure.

19 Claims, 5 Drawing Sheets

(52) U.S. Cl.
CPC ........ *H01M 10/482* (2013.01); *B60L 11/1861* (2013.01); *B60L 11/1864* (2013.01); *G01R 31/3651* (2013.01); *G01R 31/3679* (2013.01); *Y02T 10/7044* (2013.01); *Y02T 10/7061* (2013.01)

(58) Field of Classification Search
USPC ....................................................... 307/10.1
See application file for complete search history.

(56) References Cited

U.S. PATENT DOCUMENTS

| | | | |
|---|---|---|---|
| 2007/0222418 A1 | 9/2007 | Le Gall et al. | |
| 2008/0233471 A1* | 9/2008 | Aumayer et al. | 429/92 |
| 2008/0238432 A1* | 10/2008 | Botker et al. | 324/434 |
| 2010/0250162 A1* | 9/2010 | White | G01R 31/3679 |
| | | | 702/63 |

OTHER PUBLICATIONS

International Search Report corresponding to PCT Application No. PCT/EP2011/057529, mailed Aug. 8, 2011 (German and English language document) (7 pages).

* cited by examiner

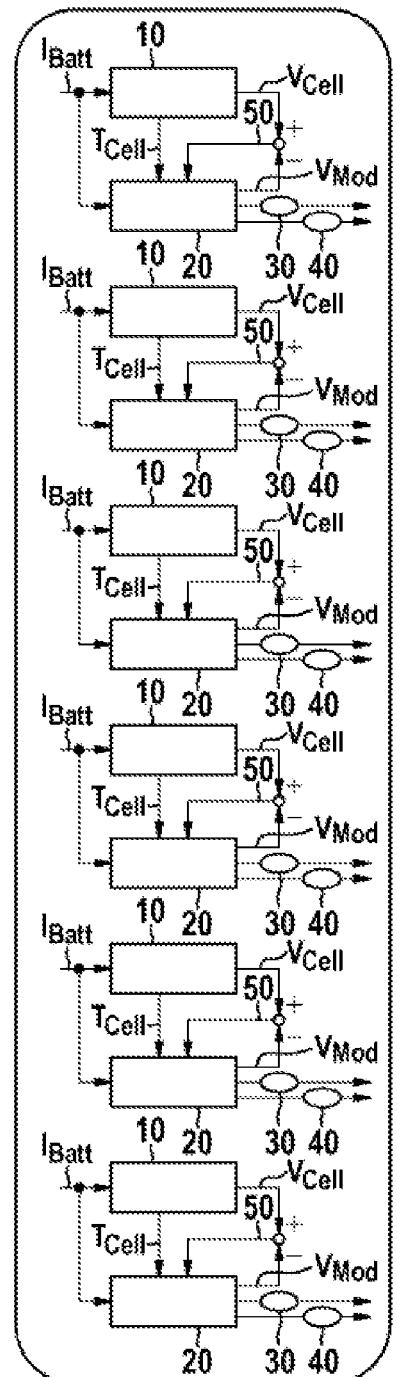

METHOD FOR DETERMINING AT LEAST ONE STATE OF A PLURALITY OF BATTERY CELLS, COMPUTER PROGRAM, BATTERY AND MOTOR VEHICLE

This application is a 35 U.S.C. §371 National Stage Application of PCT/EP2011/057529, filed on May 10, 2011, which claims the benefit of priority to Serial No. DE 10 2010 030 491.3, filed on Jun. 24, 2010 in Germany, the disclosures of which are incorporated herein by reference in their entirety.

The present disclosure relates to a method for determining at least one state of a plurality of spatially combined battery cells which are connected to one another by circuitry.

Furthermore, the present disclosure relates to a computer program with which the method according to the disclosure can be implemented, and to a battery having at least one battery management system, wherein the battery management system is embodied in such a way that the method according to the disclosure can be implemented with it. Furthermore, the disclosure relates to a motor vehicle having a battery according to the disclosure.

A battery which comprises one or more galvanic battery cells serves as an electrochemical energy accumulator and energy converter. During the discharging of the battery or of the respective battery cell, chemical energy stored in the battery is converted into electrical energy by an electrochemical redox reaction. This electrical energy can therefore be requested by a user according to requirements.

In particular, in hybrid vehicles and electric vehicles, lithium-ion batteries or nickel-metal-hydride batteries, which are composed of a large number of electrochemical cells connected in series, are inserted into what are referred to as battery packs. A battery management system including a battery state detection means usually serves to monitor safety and to ensure a service life which is as long as possible.

BACKGROUND

DE 199 59 019 A1 discloses a method for detecting a state of an energy accumulator by means of which precise and reliable energy accumulator diagnostics can be carried out using a model, a filter and a parameter estimator. By means of the estimation of parameters it is possible to determine model parameters which come about owing to the aging of the energy accumulator or owing to defects, and to continuously approximate and adjust the model, on which the estimations are essentially based, to the actual state.

For the purpose of monitoring safety and to ensure a service life which is as long as possible, it is also known to measure the voltage of each individual cell together with the battery current and the battery temperature and to perform a state estimation in respect of the state of charge and/or the state of health.

In technically high-quality battery management systems control observer structures are used. Such an observer structure is illustrated, for example, in FIG. 1.

An observer is understood to be a system which determines and/or derives states by means of a model and by using known, defined input variables and/or measurement variables. The magnitude of such states usually cannot be measured owing to their complexity, or can be measured only at very high cost.

In the model, the observer therefore models an actual controlled system or a real system. It can comprise a controller which models the measurable state variables. A known observer is what is referred to as the Luenberger observer.

By using an observer or an observer structure as illustrated in FIG. 1, it is possible to precisely determine the states of the service life and the performance of a battery pack at any time. The cell models which are used here correspond to theoretical figures or mathematical models. They have numerous parameters for describing the capacity and the impedance of the individual cell. Energy contents and performance of the cells and of the entire pack as well as service life predictions are calculated from these parameters. These values can also be parameters of the cell models and/or of the observer structure.

The parameters themselves very frequently have multi-dimensional dependencies on state variables such as, for example, temperature, state of charge, current strength and similar variables. This therefore results in complex parameter spaces in which the parameters can be observed. A dedicated observer is assigned to each cell.

For the purpose of correcting each cell model, adjustment has to be continuously made between the cell model and the respective cell with respect to the conditions or their variables, such as for example temperature, which are actually prevailing at or in the respective battery cell.

Conventional observer structure 20 is, as illustrated in FIG. 1, arranged parallel to a battery cell 10. The value of a current $I_{Bat}$ which flows through the battery cell 10 is fed as information to the observer structure 20. Likewise, the value of a temperature, measured at or in the battery cell 10, of the cell $T_{cell}$ is fed to the observer structure 20. The voltage $V_{cell}$ which is measured at the battery cell 10 is compared with the model voltage $V_{Mod}$ determined in the cell model of the observer structure 20, and the value of the resulting difference voltage 50 is fed again to the observer structure 20. The states of charge 30 and of health 40 are estimated by the observer structure 20.

The illustrated observer structure 20 is not restricted to determining the state of charge 30 and the state of health 40 alone here but rather further states can also be determined depending on requirements and as a function of the calculation capacity. Likewise, the observer structure 20 is not restricted to the inputting of the values of the current strength, temperature and voltage.

When the observer structure is applied for sensing states of battery cells, each individual cell is adjusted not only in its state of charge but also in age-specific parameters such as what is referred to as the "state of health" (SOH), using the cell model and the control observer structure.

It is disadvantageous here that this process entails enormous computational complexity and memory requirements, which also increase proportionately with the number of cells. This is unfavorable with respect to the scalability, usually desired by the automobile industry, of battery platform systems which are essential in performance which differs with respect to the reduction of complexity and costs in the manufacture of battery systems of differing performance, and the computing power which is required as a result.

SUMMARY

According to the disclosure, a method is made available for determining at least one state of a plurality of spatially combined battery cells which are connected to one another by circuitry, wherein the determination of the state is implemented by observing battery cells by means of at least one observer structure 20, and wherein a subset $n_x$ of a totality of battery cells $n_{tot}$ is observed and the state derived from the observation is determined for more battery cells than for the observed battery cells.

The model of the observer is here a cell model which is a mathematical representation of a battery cell which constitutes the actual controlled system.

As a result of the observation of just one subset $n_x$ of the totality of battery cells $n_{tot}$, the computational outlay and memory requirements of the battery management system can be significantly reduced.

In one refinement of the method according to the disclosure, the state can be determined by means of estimation. Alternatively, a calculation can also be performed. That is to say the observer structure estimates or calculates the state or the states.

The method according to the disclosure for determining at least one state of a plurality of spatially combined battery cells which are connected to one another by circuitry can, in particular, be configured in such a way that the respective state is determined both for the observed battery cells and also for nonobserved battery cells.

The state is preferably determined for all the battery cells of the respective pack, that is to say for the battery cells which are spatially connected to one another by circuitry.

At least one state which can be determined is the state of charge or the state of health. The method according to the disclosure is preferably configured in such a way that both states can be determined at one or more battery cells.

In a particularly advantageous embodiment of the method according to the disclosure there is provision that the totality of all the battery cells $n_{tot}$ is divided into groups, wherein in each case one subset $n_i$ of battery cells is assigned to a group, and wherein the observation takes place groupwise in an alternating fashion. This means that the states of the groups of battery cells are determined in succession. It is appropriate here for the method to be sequenced in a loop. This alternating observation of a reduced number of cells instead of the simultaneous observation of all the cells is an important aspect of the disclosure. The groupwise observation permits the computational complexity and memory requirements of the battery management system to be significantly reduced, and at the same time the observation quality is hardly decreased compared to observation of all the battery cells since all the groups are observed in succession and the states which are derived or determined from the observation are referred to all the battery cells.

In a preferred further refinement of the method there is provision that the observation is implemented by means of a cell model which has at least one parameter from which at least one state of the battery cell can be calculated.

The duration of the observation of the battery cells $t_B$ preferably has a relationship with an observation time period $t_{obs}$ such that $t_B/t_{obs}$ is in a range between approximately $1/(5*10^6)$ and approximately $1/(5*10^5)$. An observation time period $t_{obs}$ of ten years (i.e., approximately $5*10^6$ minutes) is assumed for a battery which provides the driving power of a motor vehicle. The duration of the observation of the battery cells $t_B$ is approximately 1 to 10 minutes, and preferably 1 to 5 minutes.

A time constant $\tau obs$ on which the cell model is based is also advantageously significantly smaller than the observation time period $t_{obs}$. For example, an observation time period $t_{obs}$ of ten years or approximately 100,000 kilometers traveled corresponds to approximately 2000 operating hours. The time constant $\tau_{obs}$ can in this case be less than 1 hour.

The knowledge of the basic method of functioning of the totality of the battery cells and, in particular, of the uniform application of certain influences or physical variables to all the battery cells permits a configuration of the inventive method in which for at least one parameter $\upsilon$ it is analyzed how large the variation $\sigma$ of the parameter $\upsilon_i$ of the totality of the battery cells $n_{tot}$ is, wherein in the case of the variation $\sigma$ not exceeding a previously defined limiting value $\sigma_{max}$, an average change in the parameter $\Delta\upsilon_k$ is used for the determination of the respective state of all the battery cells of the totality of the battery cells $n_{tot}$.

This use of the average change in the parameter $\Delta\upsilon_k$ can take place here by direct calculation thereof or in a weighting with a defined factor.

As a result, a reduction in the observation quality can be avoided by utilizing the basic method of functioning of battery packs.

Furthermore, according to the disclosure, a computer program is made available which, after it has been loaded into storage means of the data processing device, permits said data processing device to carry out the method according to the disclosure for determining at least one state of a plurality of spatially combined battery cells which are connected to one another by circuitry.

The present disclosure is supplemented by a computer-readable storage medium on which a program is stored which, after it has been loaded into storage means of the data processing device, permits said data processing device to carry out the method according to the disclosure; as well as by a method in which the computer program is downloaded from an electronic data network such as, for example, the Internet, to a data processing device connected to the data network.

Furthermore, according to the disclosure, a battery, in particular a lithium-ion battery or nickel-metal-hydride battery, is made available, wherein the battery comprises spatially combined battery cells which are connected to one another by circuitry as well as at least one battery management system, and can be connected or is connected to a drive system of a motor vehicle, wherein the battery management system is designed to implement the method according to the disclosure in order to determine at least one state of a plurality of spatially combined battery cells which are connected to one another by circuitry.

Furthermore, according to the disclosure, a motor vehicle is made available which comprises at least one battery according to the disclosure.

By means of the method according to the disclosure it is possible to reduce the computational complexity and storage requirements of battery management systems with respect to the adjustment of the parameters of the observed cells. In addition, the scalability of battery platform systems and of the battery management systems connected thereto can be improved with defined, limited hardware resources.

In addition to the advantages already mentioned, lower hardware costs and/or fewer hardware variants which are dependent on the number of battery cells are necessary. A relatively high observation quality is ensured since no significant loss of information is found to occur during the observation of subsets of battery cells, in particular during the alternating observation. The observer structure can be implemented by means of software and suitable processors and is accordingly cost-effective.

BRIEF DESCRIPTION OF THE DRAWINGS

The disclosure will be explained in more detail with reference to the following description and to the drawings, in which.

Figure 1:
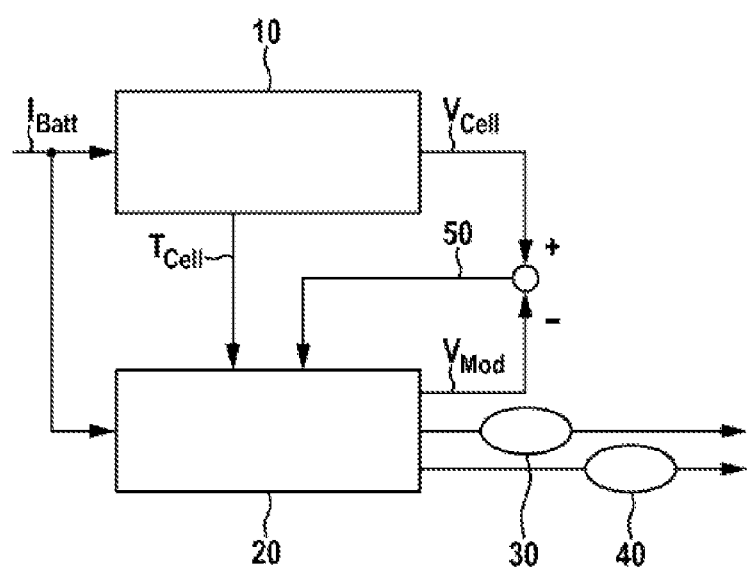
FIG. 1 shows a battery cell provided with a conventional observer structure.

The conventional observer structure illustrated in FIG. 1 has already been described in the explanation of the prior art.

DETAILED DESCRIPTION

Figure 2B:
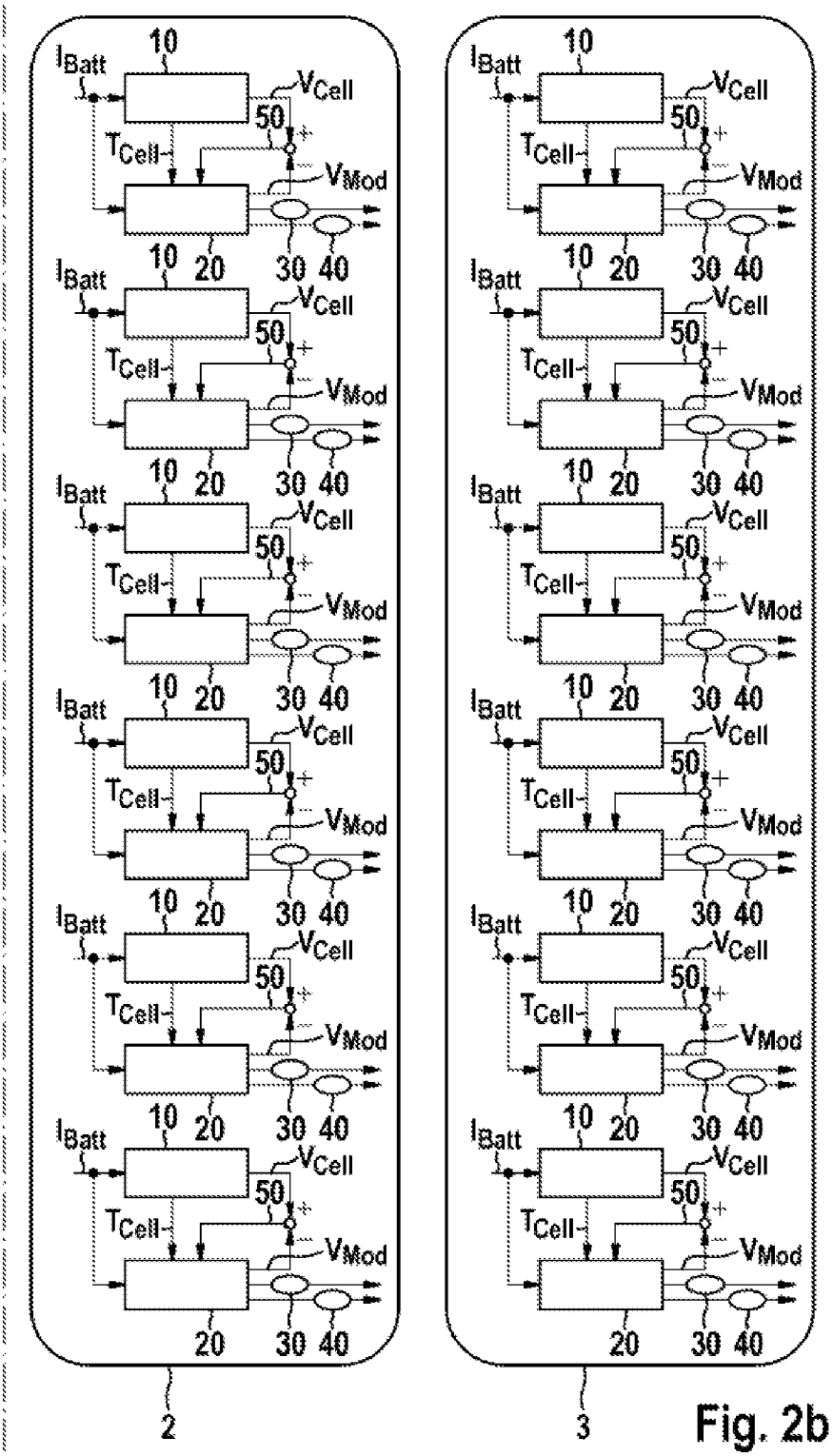
FIG. 2 shows division of the battery cells and observer structures into groups.
Figure 2C:
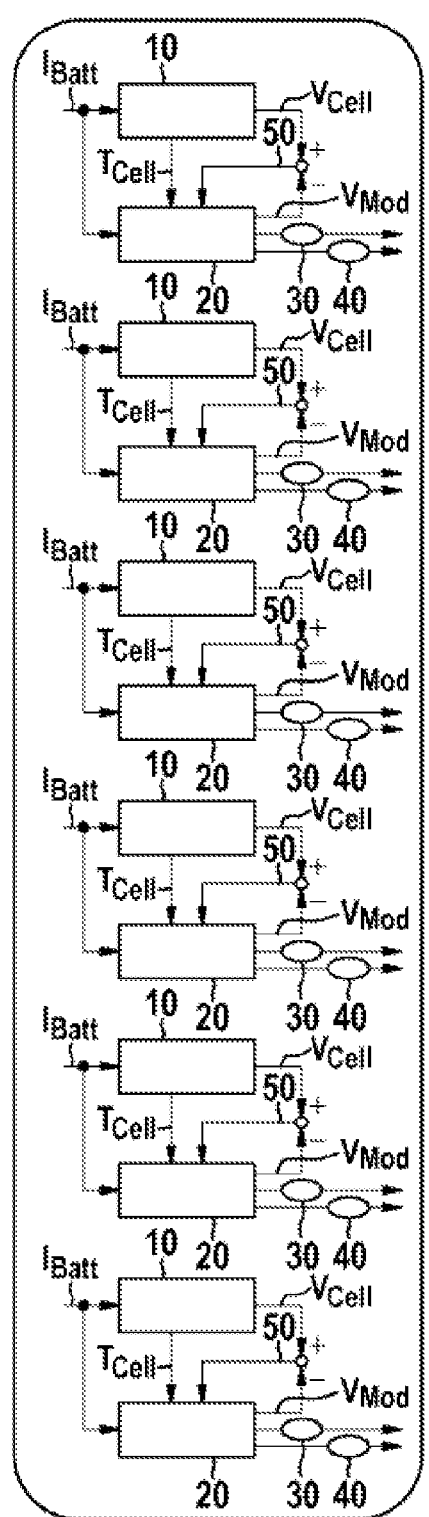

In FIG. 2 the totality of all the battery cells which are to be sensed with respect to at least one of their states is illustrated. The battery cells 10 and the observer structures 20 assigned thereto are divided into four groups 1, 2, 3 and 4.

The disclosure is, however, not restricted here to the embodiment according to FIG. 2, but instead, in contrast therewith, only a plurality of battery cells 10 can also be combined in groups without the respectively assigned observer structure, wherein in each case a group of at least one superordinate observer structure is observed. The computer power of the observer structure should be correspondingly adapted.

Figure 3:
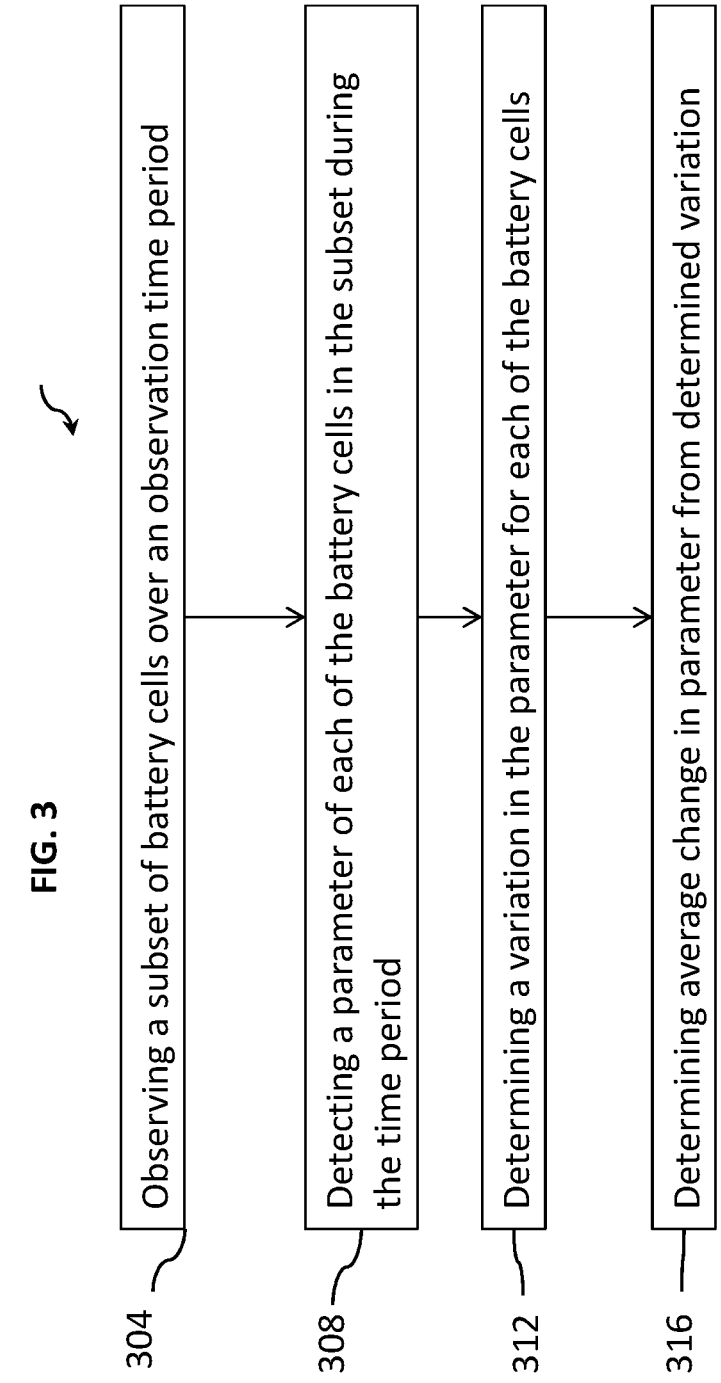
FIG. 3 shows a flow chart of one embodiment of the method to determine at least one charged state and an aging state of the battery cells.

The method (Flowchart 300 of FIG. 3) according to the invention is preferably carried out by an alternating observation of, in each case, just a subset of the installed battery cells 10, specifically the battery cells 10 assigned into, in each case, one group 1, 2, 3 or 4. (Step 304 of FIG. 3). If the pack or the totality $n_{tot}$ of all the battery cells 10 has n cells, a subset m=n/x can advantageously be observed where n, x and m are advantageously integers. In the example in FIG. 2, n=24 cells in x=4 groups of m=6 cells each are illustrated. The observation of the individual groups alternates and the numerical sequence can be selected as desired. Processing in a loop is particularly suitable.

In order to fix the required hardware resources and therefore make it possible to plan costs for the implementation of the method and keep them low, in particular the number of simultaneously observed cells m during the configuration of a battery pack can always be kept the same or below a certain limiting value. As a result, only the number of groups x is scaled with the number of cells n in the pack or in the totality $n_{tot}$ of all the battery cells 10.

Since the cell parameters which are observed are aging-dependent and since the aging of electrochemical cells usually takes place relatively slowly, the observation time periods tobs are correspondingly long. (Step 308 of FIG. 3). As long as it is ensured that the time constants τobs of the observers are significantly shorter than the observation time periods tobs (τobs<<tobs), the inventive method can be particularly advantageously applied. The duration of the observation of a group up to the next changeover can be suitably selected but should likewise be significantly shorter than the necessary observation time periods. (Step 304 of FIG. 3). It is therefore possible, for example, to assume an observation time period tobs of 10 years or approximately 100,000 kilometers traveled for a battery which provides the driving power of a motor vehicle. This corresponds to approximately 2000 operating hours. The time constant τobs can be less than 1 hour in this case, and the duration of the observation of the battery cells tB can be approximately 1 to 10 minutes, preferably 1 to 5 minutes.

Since all the cells in the observed totality of the battery cells $n_{tot}$ are preferably connected in series, they are loaded by the same battery current. This also applies in a first approximation when the totality of the battery cells $n_{tot}$ is configured with a plurality of parallel lines. As a result, the charge throughput is identical. Owing to the generally good thermal coupling between the battery cells 10 and their operation in spatial proximity, the thermal loading of the individual battery cells 10 is as expected also similar. As a result, the two main causes of aging and therefore changes in parameters for the individual battery cells 10 are virtually identical. This fact can be utilized to increase further the quality of the observation and ensure virtually uninterrupted observation.

For this purpose, for a parameter $\upsilon$ of the cell model it is analyzed how large the variation σ of the parameters $\upsilon_i$ is of all the battery cells 10 in the pack or in the totality of all the battery cells $n_{tot}$. (Step 312 of FIG. 3). Provided that σ does not exceed a limiting value which is to be defined, that is to say the battery cells 10 of the totality of all the battery cells $n_{tot}$ have similar behavior, the average change $\Delta\upsilon_k$ which is determined in the observed group can be transmitted, entirely or weighted with a factor to be defined, to all the nonobserved battery cells 10. (Step 316 of FIG. 3).

As a result, in a battery pack or in the totality of all the battery cells $n_{tot}$ it is possible, under certain, not improbable, conditions, for the observation quality of the cell parameters ideally to assume the same value as in the case of observation of all the cells at the same time, but with significantly reduced hardware expenditure.

The invention claimed is:

1. A method for determining at least one of a charge state and an aging state of a plurality of spatially combined battery cells connected to one another by circuitry, comprising:
    observing a subset of battery cells from the plurality of spatially combined battery cells using at least one observer structure over an observation time period;
    detecting a parameter of each of the battery cells of the subset during the observation time period;
    determining a magnitude of a variation in the parameter across all of the battery cells of the subset;
    determining a change in the parameter during the observation time period for each of the battery cells in the subset;
    determining an average change in the parameter for the subset of battery cells, the average change being an average of the determined changes in the parameter over the observation time period for the respective battery cells of the subset, and
    when the magnitude of the variation of the parameter across all of the battery cells in the subset does not exceed a pre-determined threshold value, using the average change in the parameter in determining at least one of the charge state and the aging state for all of the battery cells, respectively, in the plurality of spatially combined battery cells.

2. The method as claimed in claim 1, wherein the at least one of the charge state and the aging state is determined using estimation.

3. The method as claimed in claim 1, wherein the at least one of the charge state and the aging state is a state of charge or a state of health.

4. The method as claimed in claim 1, wherein:
    the plurality of the spatially combined battery cells are divided into groups,
    one subset of battery cells being assigned to a group, and the observation taking place groupwise in an alternating fashion.

5. The method as claimed in claim 1, wherein a ratio of a duration of the observation of the battery cells ($t_B$) to the observation time period ($t_{obs}$) is in a range from approximately $1/(5*10^6)$ to approximately $1/(5*10^5)$.

6. The method as claimed in claim 1, wherein the method is implemented using a cell model, the cell model including:
the at least one parameter for calculating the at least one of the charge state and the aging state of the battery cells.

7. A computer program embodied on a non-transitory computer-readable storage medium, the computer program including instructions for causing a processor to implement a method for determining at least one of a charge state and an aging state of a plurality of spatially combined battery cells, the method comprising:
observing a subset of battery cells from the plurality of spatially combined battery cells using at least one observer structure over an observation time period;
detecting a parameter of each of the battery cells of the subset during the observation time period;
determining a magnitude of a variation in the parameter across all of the battery cells of the subset;
determining a change in the parameter during the observation time period for each of the battery cells in the subset;
determining an average change in the parameter for the subset of battery cells, the average change being an average of the determined changes in the parameter over the observation time period for the respective battery cells of the subset, and
when the magnitude of the variation of the parameter across all of the battery cells in the subset does not exceed a pre-determined threshold value, using the average change in the parameter in determining at least one of the charge state and the aging state for all of the battery cells, respectively, in the plurality of spatially combined battery cells.

8. The computer program as claimed in claim 7, wherein the at least one state is determined using estimation.

9. The computer program as claimed in claim 7, the method further comprising:
determining the at least one of the charge state and the aging state both for the observed battery cells and also for the non-observed battery cells.

10. The computer program as claimed in claim 7, wherein the at least one of the charge state and the aging state is a state of charge or a state of health.

11. The computer program as claimed in claim 7, wherein:
the plurality of the spatially combined battery cells are divided into groups,
one subset of battery cells being assigned to a group, and
the observation taking place groupwise in an alternating fashion.

12. The computer program as claimed in claim 7, wherein a ratio of a duration of the observation of the battery cells ($t_B$) to an observation time period ($t_{obs}$) is in a range from approximately $1/(5*10^6)$ to approximately $1/(5*10^5)$.

13. The computer program as claimed in claim 7, wherein the method is implemented using a cell model, the cell model including:
the at least one parameter for calculating the at least one of the charge state and the aging state of the battery cells.

14. A battery, comprising:
a plurality of spatially combined battery cells which are connected to one another by circuitry; and
at least one battery management system,
wherein the battery cells are connectable to a drive system of a motor vehicle,
wherein the battery cells are a lithium on battery or a nickel metal hydride battery,
wherein the battery management system is configured to implement a method for determining at least one of a charge state and an aging state of a plurality of spatially combined battery cells, and wherein the method includes:
observing a subset of battery cells from the plurality of spatially combined battery cells using at least one observer structure over an observation time period;
detecting a parameter of each of the battery cells of the subset during the observation time period;
determining a magnitude of a variation in the parameter across all of the battery cells of the subset;
determining a change in the parameter during the observation time period for each of the battery cells in the subset;
determining an average change in the parameter for the subset of battery cells, the average change being an average of the determined changes in the parameter over the observation time period for the respective battery cells of the subset, and
when the magnitude of the variation of the parameter across all of the battery cells in the subset does not exceed a pre-determined threshold value, using the average change in the parameter in determining at least one of the charge state and the aging state for all of the battery cells, respectively, in the plurality of spatially combined battery cells.

15. The battery as claimed in claim 14, wherein the at least one state is determined using estimation.

16. The battery as claimed in claim 14, the method further comprising:
determining the at least one of the charge state and the aging state both for the observed battery cells and also for the non-observed battery cells.

17. The battery as claimed in claim 14, wherein the at least one of the charge state and the aging state is a state of charge or a state of health.

18. The battery as claimed in claim 14, wherein:
the plurality of the spatially combined battery cells are divided into groups,
one subset of battery cells being assigned to a group, and
the observation taking place groupwise in an alternating fashion.

19. A motor vehicle comprising:
at least one battery including (i) a plurality of spatially combined battery cells which are connected to one another by circuitry and (ii) at least one battery management system,
wherein the battery is connected to a drive system of the motor vehicle,
wherein the battery is a lithium on battery or a nickel metal hydride battery,
wherein the battery management system is configured to implement a method for determining at least one of a charge state and an aging state of the plurality of spatially combined battery cells, and wherein the method includes:
observing a subset of battery cells from the plurality of spatially combined battery cells using at least one observer structure over an observation time period;
detecting a parameter of each of the battery cells of the subset during the observation time period;

determining a magnitude of a variation in the parameter across all of the battery cells of the subset;

determining a change in the parameter during the observation time period for each of the battery cells in the subset;

determining an average change in the parameter for the subset of battery cells, the average change being an average of the determined changes in the parameter over the observation time period for the respective battery cells of the subset, and when the magnitude of the variation of the parameter across all of the battery cells in the subset does not exceed a pre-determined threshold value, using the average change in the parameter in determining at least one of the charge state and the aging state for all of the battery cells, respectively, in the plurality of spatially combined battery cells.

* * * * *

UNITED STATES PATENT AND TRADEMARK OFFICE
CERTIFICATE OF CORRECTION

PATENT NO. : 9,746,523 B2  
APPLICATION NO. : 13/805309  
DATED : August 29, 2017  
INVENTOR(S) : Boehm et al.

It is certified that error appears in the above-identified patent and that said Letters Patent is hereby corrected as shown below:

In the Claims

In Column 8, Lines 3-4, Lines 7-8 of Claim 14 should read:
wherein the battery cells are a lithium ion battery or a
    nickel metal hydride battery, In Column 8, Lines 56-57, Lines 8-9 of Claim 19 should read:
wherein the battery is a lithium ion battery or a nickel
    metal hydride battery, Signed and Sealed this
Twenty-first Day of November, 2017

Joseph Matal
*Performing the Functions and Duties of the
Under Secretary of Commerce for Intellectual Property and
Director of the United States Patent and Trademark Office*